United States Patent [19]
Pritchard

[11] Patent Number: 5,434,536
[45] Date of Patent: Jul. 18, 1995

[54] SEMICONDUCTOR EMULATION OF VACUUM TUBES

[76] Inventor: Eric K. Pritchard, Rte. 1, Box 536, Berkeley Springs, W. Va. 25411

[21] Appl. No.: 914,596

[22] Filed: Jul. 20, 1992

Related U.S. Application Data

[63] Continuation-in-part of Ser. No. 466,865, Jan. 18, 1990, Pat. No. 5,133,014, which is a continuation-in-part of PCT/US88/01025, Mar. 23, 1988, Pat. No. 4,995,084, which is a continuation-in-part of Ser. No. 29,144, Mar. 23, 1987, Pat. No. 4,809,336.

[51] Int. Cl.⁶ .................. H01J 19/82; H03L 5/00
[52] U.S. Cl. .................. 327/599; 327/306; 327/334
[58] Field of Search .......... 307/490, 493, 264; 327/306, 334, 340, 560, 597, 598, 599

[56] References Cited

U.S. PATENT DOCUMENTS

| | | | |
|---|---|---|---|
| 3,211,901 | 10/1965 | Comley, Jr. et al. | 235/197 |
| 3,281,585 | 10/1966 | Zseleczky et al. | 235/197 |
| 3,510,806 | 5/1970 | Gremillet | 307/304 |
| 3,523,195 | 8/1970 | Thomas et al. | 307/229 |
| 3,742,261 | 6/1973 | Schneider | 330/277 |
| 3,828,230 | 8/1974 | Nishizawa et al. | 357/22 |
| 3,835,409 | 9/1974 | Laub | 330/13 |
| 3,860,876 | 1/1975 | Woods | 328/167 |
| 3,930,202 | 12/1975 | Dever | 328/142 |
| 4,211,893 | 7/1980 | Smith | 330/149 |
| 4,314,207 | 2/1982 | Pinternagel | 330/110 |
| 4,330,754 | 5/1982 | Hartley | 330/264 |
| 4,405,832 | 9/1983 | Sondermeyer | 179/1 D |
| 4,439,742 | 3/1984 | Sondermeyer | 330/262 |
| 4,495,640 | 1/1985 | Frey | 381/61 |
| 4,627,094 | 12/1986 | Scholtz . | |
| 4,672,671 | 6/1987 | Kennedy | 381/61 |
| 4,752,960 | 6/1988 | Scholz | 381/61 |
| 4,811,401 | 3/1989 | Brown, Sr. et al. | 381/61 |
| 4,899,115 | 2/1990 | Christian | 330/302 |
| 4,987,381 | 1/1991 | Butler | 330/255 |
| 5,032,796 | 7/1991 | Tiers et al. | 330/110 |

OTHER PUBLICATIONS

Das Elektron International, No. 3, 1975, Linz Austria, pp. 87–88, P. Solomon, 'Zwei Aufsteck—Verzerrer Fur, die Gitarre'.

T. E. Rutt, Vacuum Tube Triode Nonlinearity as Part of the Electric Guitar Sound, An Audio Engineering Society Preprint, Presented at the 76th Convention 1984 Oct. 8–11, New York.

*Primary Examiner*—Timothy P. Callahan
*Assistant Examiner*—Toan Tran
*Attorney, Agent, or Firm*—Barnes & Thornburg

[57] ABSTRACT

A semiconductor emulation of a vacuum tube with one or more of the following characteristics: non-linear output, non-linear transfer, non-linear input, reverse transfer, and second harmonic generation. Also an emulator with a second output to emulate a phase splitter, a semiconductor emulator of a cathode follower, and a compressor emulating the effects of a power supply droop and screen grid behavior are disclosed.

69 Claims, 3 Drawing Sheets

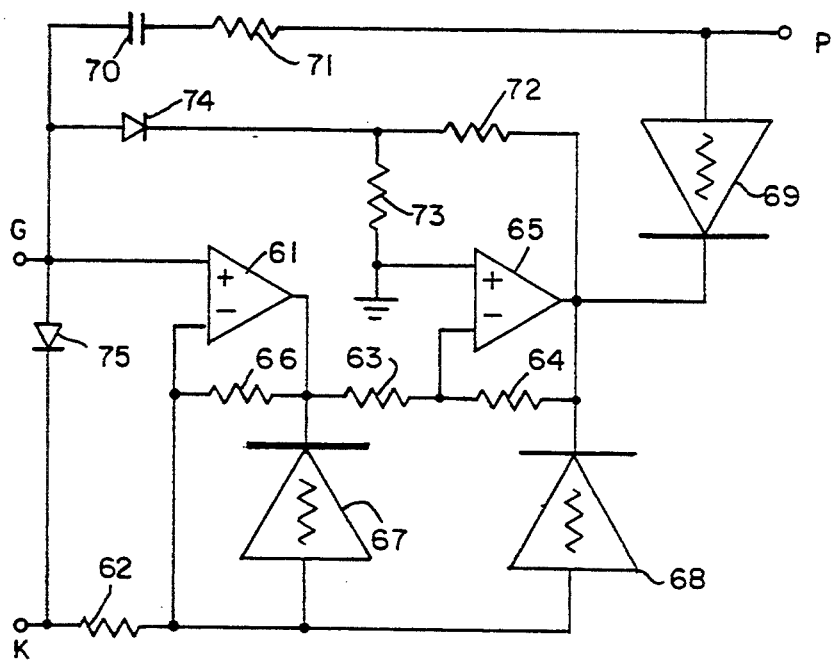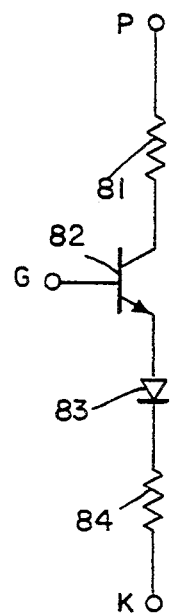
FIG. 7  FIG. 8
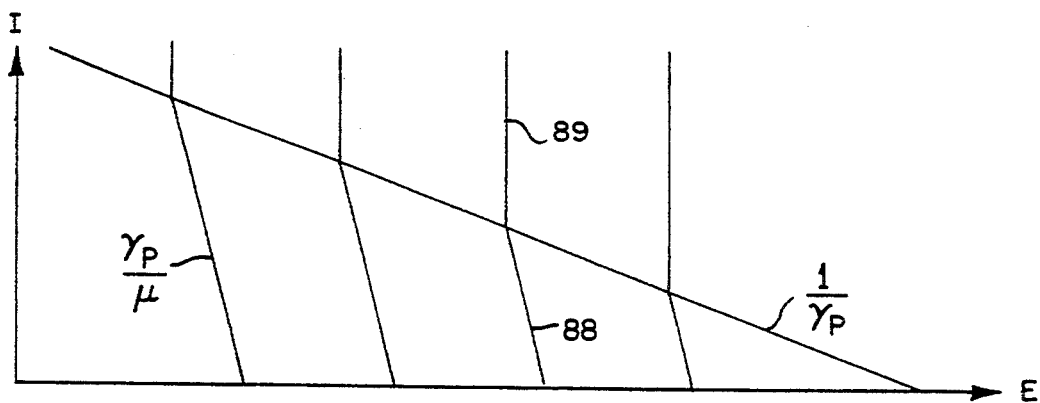
FIG. 9
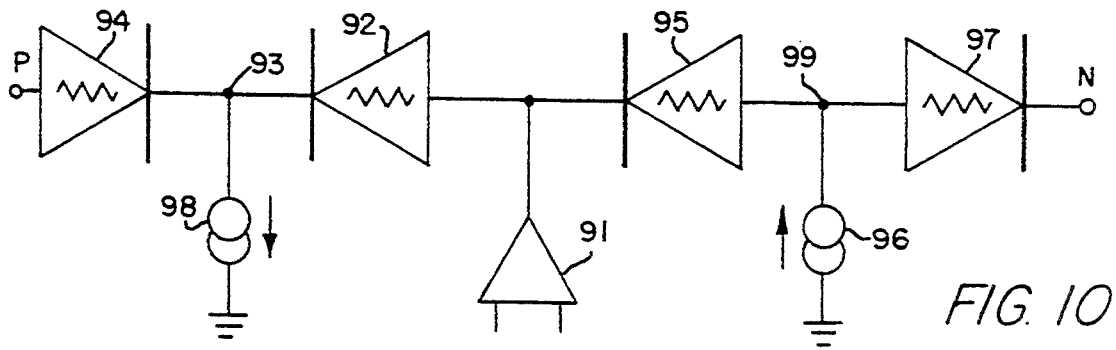
FIG. 10

SEMICONDUCTOR EMULATION OF VACUUM TUBES

CROSS REFERENCE

This is a continuation-in-part of U.S. application Ser. No. 07/466,865 filed Jan. 18, 1990, which is now U.S. Pat. No. 5,133,014 issued Jul. 21, 1992, which is a continuation-in-part of PCT/US88/01025 filed Mar. 23, 1988, which is now U.S. Pat. No. 4,995,084 issued Feb. 19, 1991, which is a continuation-in-part of U.S. Ser. No. 29,144 filed Mar. 23, 1987, which is now U.S. Pat. No. 4,809,336 issued Feb. 28, 1989.

BACKGROUND

This invention relates to vacuum tube amplifier emulation, and to non-linear semiconductor amplifiers.

Tube amplifier emulation does model the tube amplifier in such detailed terms as plate resistance and effects of the screen grid. The plate resistance of a triode is particularly unique since all semiconductors have extensive regions of current limits.

Accurate modeling of the plate resistance is needed when tubes drive non-resistive or non-linear loads. A popular analysis of vacuum tube distortion components lumps the variable gain with the variable output impedance and represent it as a resistive load. This analysis does not hold with reactive or non-linear loads and there are no closed form solutions which would lead to a model.

The object of this invention is a semiconductor emulation for emulating a vacuum tube with one or more of the following characteristics: non-linear output, non-linear transfer, non-linear input, reverse transfer, and second harmonic generation.

Another object is an emulator with a second output to emulate a phase splitter.

Another object is a semiconductor emulator of a cathode follower.

Still another object is a compressor emulating the effects of a power supply droop and screen grid behavior.

Other objects, advantages and novel features of the present invention will become apparent from the following detailed description of the invention when considered in conjunction with the accompanying drawings.

BRIEF DESCRIPTION OF THE DRAWINGS

FIG. 7 is a schematic of another embodiment of a triode emulation circuit.

FIG. 8 is a schematic of a cathode follower emulator.

FIG. 9 is a graph of the output characteristics of the circuit of FIG. 8.

FIG. 10 is a schematic of a phase splitter emulator for bipolar amplifiers.

BEST MODES FOR CARRYING OUT THE INVENTION

THE NON-LINEAR NETWORKS

Figure 1:
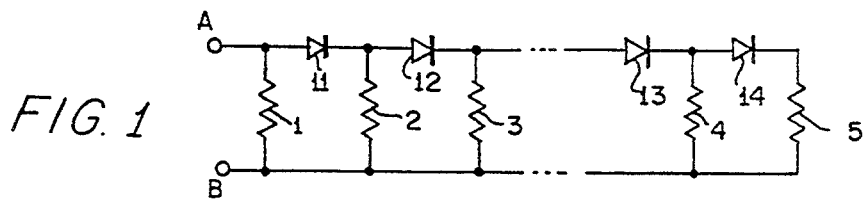
FIGS. 1 and 2 are schematics of non-linear resistor-diode networks.

The resistor-diode network of FIG. 1 is described in U.S. patent application Ser. No. 07/466,865, now U.S. Pat. No. 5,133,014 issued Jul. 21, 1992. It is a plurality of parallel resistors 1-5 series diodes 11-14. For input voltages across terminals A and B of less than one diode drop, only resistor 1 conducts. For input voltages between one and two diode drops, resistors 1 and 2 conduct. Higher voltages make more resistors conduct, thereby lowering the dynamic resistance of the network.

Figure 2:
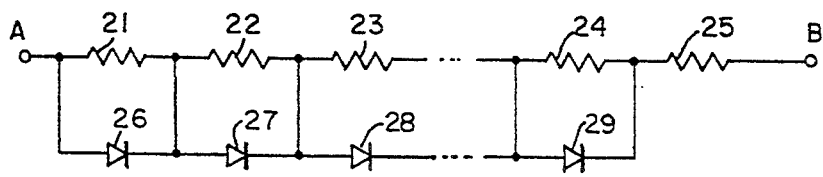

The resistor-diode network of FIG. 2 has a plurality of parallel resistor and diode pairs in series. As the current flowing from terminal A to B increases, the voltage across the resistors increases. When the resistor voltage approaches the diode drop, the diode conducts and dynamically removes the resistor from the series string. When all of the diodes conduct, the resistance of the network is the resistance of resistor 25.

There is a rough equivalency between these networks: Equal resistors in FIG. 1 produces a current approximately proportional to the square of the voltage across the terminals. Similarly, if the resistors of FIG. 2 are in the ratios of 1, $\frac{1}{3}$, 1/6, 1/10, 1/15 ... and the last resistor, the nth, is 2/n, then it too produces a current approximately proportional to the square of the voltage across the terminals A and B.

It should be noted that the networks approximate the desired function over a region. The diodes tend to sectionalize the function and eventually all of the diodes are on and the network becomes linear.

Figure 3:
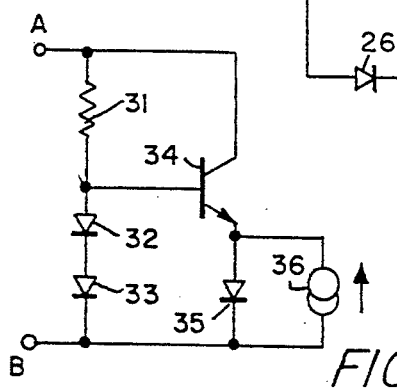
FIG. 3 is a schematic of a non-linear semiconductor network.

FIG. 3 also produces a squared current using semiconductor behavior found in logarithm amplifiers. The voltage across the terminals A and B is converted to a current by resistor 31. This current produces a voltage on the base of transistor 34 proportional to twice the logarithm of the current. The transistor 34 converts that voltage to a current in an exponential manner proportional to the square of the current through resistor 31 or the voltage across the terminals A, B. This is made possible by biasing diode 35 with current source 36.

This non-linear circuit uses an active semiconductor, namely a transistor, to replace many passive semiconductors, diodes.

Figure 4:
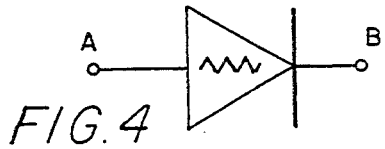
FIG. 4 is a symbol for a non-linear network.

For brevity in the drawings, a new symbol shown in FIG. 4 will indicate a non-linear network as shown in FIGS. 1, 2, or 3.

A TRIODE

Figure 5:
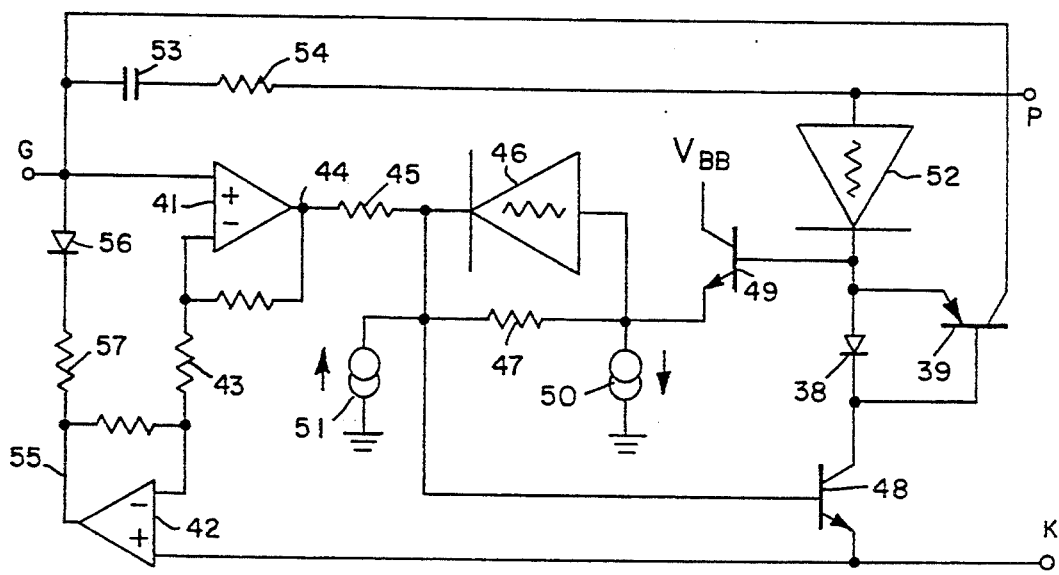
FIG. 5 is a schematic of a triode emulation circuit.

The circuit of FIG. 5 approximates a triode. The terminals G, K, and P represent the grid, cathode, and plate respectively. The grid-to-cathode voltage is transferred by amplifiers 41 and 42 to resistor 43. The voltages at outputs 44 and 55 of amplifier 41 and 42 respectively are then proportional to the grid-to-cathode voltage. The components 45-49 form a non-linear inverting amplifier with input resistor 45 and feed-back created by resistor 47 and network 46. Transistor 48 is the amplifier and transistor 49 isolates the feedback from the output circuit. The gain from the grid G to the collector of 48 approximates the μ of the triode. Network 52 approximates the plate resistance, capacitor 53 is the plate-to-grid "Miller" capacitance while resistor 54 is a stabilizing resistor. The voltage at 55 scales the non-linear characteristics of diode 56 and resistor 57 to the grid-to-cathode diode characteristics, approximately. By proportioning the gains of amplifiers 41 and 42 to the resistances 45 and 57, any current flowing in diode 56 will produce an equal current into the cathode terminal K.

The optional diode 38 and transistor 39 sense the plate current and feedback a small portion to the grid G, about 0.1 percent, to simulate the negative grid current. This feedback is only important for extremely high input impedance amplifiers, such as capacitor microphone preamplifiers.

Figure 6:
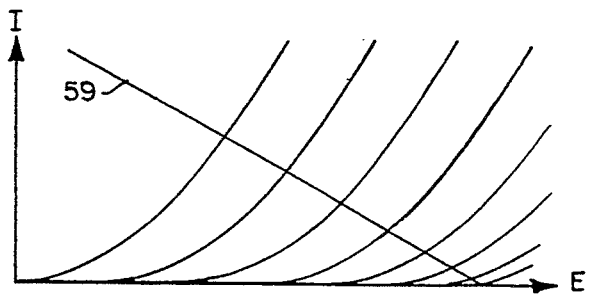
FIG. 6 is a graph of the output characteristics of the circuit of FIG. 5.

The resulting output characteristics are shown in FIG. 6. Although the curves are not precisely like a tube characteristics, they are very close to the same around load line 59. This is further evidenced by similar distortions characteristics and intermodulation spectra.

The output characteristics of FIG. 6 show the upward sweeping shape of a vacuum triode and do not show the current limiting characteristics of pentodes and semiconductors. Even gate 2-to-drain connected dual gate FETs show current limiting.

The networks 46 and 52 preferably produce currents proportional to the square of the voltages across them so the circuit produces second harmonics. Squaring networks as described above are not perfect and produce a desired amount of third harmonics also.

FIG. 7 illustrates another embodiment of a triode emulation circuit which makes the approximation that the plate current does not need to go through the cathode. Amplifier 61 transfers the grid-to-cathode voltage across resistor 62. Resistors 63 and 64 with amplifier 65 form a unity gain inverting amplifier. When the grid-to-cathode voltage is negative, resistor 66 and network 67 form the feedback for amplifier 61. When this voltage is positive, resistor 66 and network 68 forms the feedback under the control of amplifier 65. Network 69 forms the plate resistance. Capacitor 70 is the grid-to-plate "Miller" capacitance while resistor 71 stabilizes the circuit. Resistors 72 and 73 scale the conduction voltage of diode 74 to the grid-to-cathode diode 75. Although this does not pass the grid current to the cathode, it is a good approximation in high impedance grid circuits. Diode 74 can also be replaced or implemented by the base-emitter junction of a PNP transistor with its collector connected to the cathode terminal K. Alternatively, the network 72–74 may be deleted and diode 75 replaced by a Schottkey diode 75.

The circuit of FIG. 7 is biased differently than the circuit of FIG. 5 and produces plate voltages below the cathode voltage. But, the capacitive coupling to the next stage or the rebiasing of the next stage adjusts for the difference. The operation along the load line is similar since the intermodulation spectra is virtually identical to −70 dB. This was done with all of the networks having second order characteristics of squaring to produce second harmonics.

The networks 46, 67 and 68 provide harmonics without clipping. The networks 52 and 69 also provide harmonics without clipping and control the harmonic generation when going into cutoff. Diodes 56, 74 and 75 control the bottom of the waveform shape and consequently the harmonic generation.

Diodes 56, 74 and 75 may be replaced by a diode network.

An analysis of the networks 52 and 69 operating with a load resistor produces a cubic component which is trigonometrically converted to fundamental and third harmonics. The fundamental component is phased to reduce the output. This is one contributor to the compressive nature of vacuum tubes. The gain goes down as the signal is increased.

The circuit of FIG. 8 is a cathode follower emulator with transistor 82 providing gain and optional diode 83 assuring reverse current does not flow. Resistor 81 is proportional to the zero grid voltage plate resistance while resistor 84 is proportional to the inverse of the transconductance.

FIG. 9 is the approximate output characteristic of cathode followers and the circuit of FIG. 8. Line 88 represents the normal operation of the cathode follower. However, when the current becomes excessive, the grid voltage goes positive and conducts heavily. This is emulated by transistor 82 saturating and the base conducting heavily as line 89 shows. These characteristics belie the name of follower, since the circuit produces the same voltage out of it is able, otherwise produces no current or loads the previous stage.

FIG. 10 is an approximation to the phase splitter for a bipolar amplifier which requires both inputs in-phase. Since the two triodes in a differential amplifier phase splitter compensate each other, the stage produces very little distortion until clipping. The output resistance of the phase splitter is about twice the triode plate resistance normally, but becomes nearly infinite when clipping.

When the output of amplifier 91 goes high, network 92 pulls up voltage at 93. When the voltage at 93 approaches the plate voltage P, network 94 becomes more resistive and disconnects when voltage at 93 is greater than the voltage at P. At the same time, network 95 disconnects and the current from source 96 flows through network 97 to plate N. Symmetric behavior occurs when the amplifier 91 output goes negative: network 92 disconnects, P has current from current source 98, network 95 pulls down voltage at 99, and network 97 disconnects from plate N.

The networks 94, 95 and 97 use an extra diode in series with the input to keep reverse currents from flowing. Network 92 does not emulate the low gain of the differential amplifier when the triode opposite the input is cut off.

Figure 11:
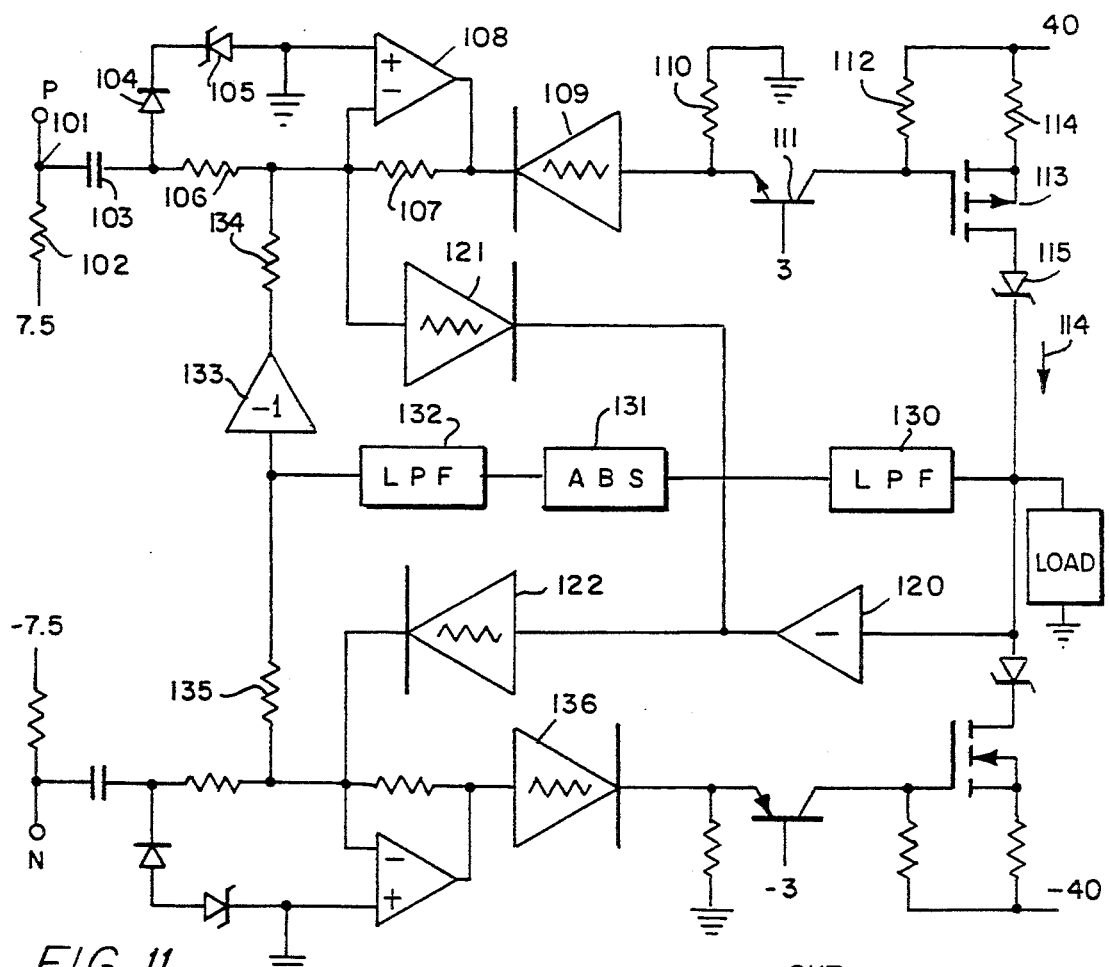
FIG. 11 is a schematic of a bipolar amplifier.

The circuit of FIG. 10 provides the soft cutoff for the grid circuit of the output state, of the circuit of FIG. 11. FIG. 11 shows a bipolar push-pull output which emulates push-pull pentodes with a poorly regulated supply. Since the negative half operates symmetrically to the positive half, only the positive half will be detailed. Outputs P and N of FIG. 10 are connected to inputs P and N of FIG. 11. Resistor 102 is the plate resistor. Capacitor 103 is the coupling capacitor. Diodes 104 and 105 emulate positive grid conduction. Zener diode 105 adjusts for the nominal zero bias of this stage. Resistor 106 is the grid resistor which drives amplifier 108 with feedback resistor 107. Network 109 is nominally a squaring, second order emulation of the pentode transfer characteristic. This gain varying characteristic provides smooth crossover and the variable gain for emulating tube compression. Amplifier 111, shown as a transistor, shifts the level of the signal to the output supply voltage +40 with the help of resistor 112. MOSFET 113 with source resistor 114 transfers the voltage on resistor 112 to a current through resistor 114. Bias resistor 110 is adjusted to overcome the threshold voltage of MOSFET 113. The remaining bias is established by the voltage on the base of transistor 111. Zener diode 115 allows the load to fly back some before it is clamped.

The components 103–106 form a bias-shifter as do the grid circuit and the grid conduction diodes of the circuits of FIGS. 5 and 7.

Figure 12:
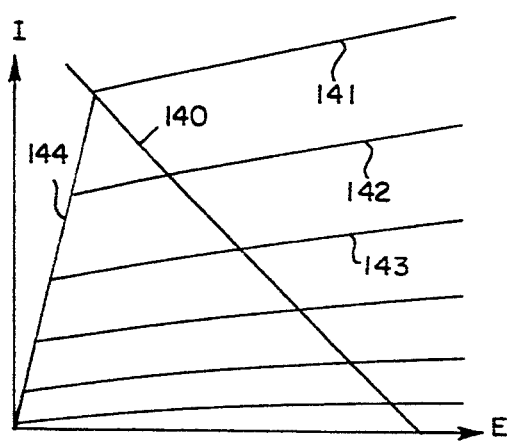
FIG. 12 is a graph of the output characteristics of half of the circuit of FIG. 11.

Inverting amplifier 120 and non-linear networks 121 and 122 feedback the output to emulate the plate resistance of a pentode. Notice that the feedback loop goes through both non-linear networks. Consequently, the plate resistance and transfer characteristic are functions of both the output and the input. This is seen in the different slopes of curves 141–143 of FIG. 12.

The saturation region 144 is emulated by resistor 114. Again, the entire characteristic is not perfect, but around the load line 140, it is a good approximation.

The poor regulation of the power supply coupled with screen grid operation creates the compression found in tube amplifiers. When the power supply sags under the load of large signals, the screen voltage goes down in a manner dictated by the power supply filter. The drop in screen voltage lowers the output current and lowers the gain of the tube.

The screen grid voltage shift can be lumped into a control grid shift according to Thomas Martin in his book *Electronic Circuits*, Prentice-Hall, pages 84–87 providing the signal is scaled appropriately.

Although the power supply could drive this circuit, it is simpler to estimate the output current with filter 130. The resulting signal is rectified by 131 and then filtered by 132 which has the same time constants and overshoot as the emulated power supply. The output of 132 is fed to the negative half by resistor 135 while being inverted by 133 and fed to the positive half by resistor 134. An increasing output then reduces the bias on networks 109 and 136, reduces the output currents, increases the resistance of these networks and lowers the gain. The compression control signal from the output of filter 132 is canceled in the output.

This is similar to the behavior of tube compressor/expanders such as the expander, FIG. 16.10, *Radiotron Designers Handbook*. RCA Corporation, 1954.

The difference lies in the characteristics of the filter 132. Compressors react quickly to rising signals and slower to falling signals. But the power supply reacts similarly in both directions at a medium rate. The filters of compressors are non-linear single pole while the power supply is multipole and may have overshoot.

The input to filter 130 may be taken from the output in a feedback fashion or may be taken from an input for a feed forward operation.

The amplifier is an example of a controlled means, others include voltage controlled amplifiers and photo-resistive devices.

Figure 14:
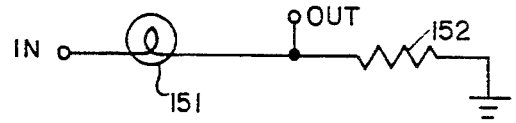
FIG. 14 is a schematic of a lamp compressor.

FIG. 14 is an example of a lamp controlled compressor. The lamp 151 has a positive resistance change with temperature. A large signal on the input heats the lamp filament increasing its resistance and consequently the attenuation of the output as appears across resistor 152. The thermal characteristics of the lamp or other device with a high resistance temperature coefficient is a filter producing heat and the heat produces a resistance change which changes the ratio of input to output. By picking the right lamp or resistance temperature coefficient means properly, a good approximation to power supply response can be achieved. By picking the proper resistance, the proper compression of 1 or 2 dB can be easily achieved.

In addition to the triode configuration illustrated in FIGS. 5 and 7, a pentode emulation is achieved in FIG. 11. A control grid input would be on resistor 106, the screen grid input would be on resistor 134, the plate produces current through 114.

COMPUTER OPERATION

Figure 13:
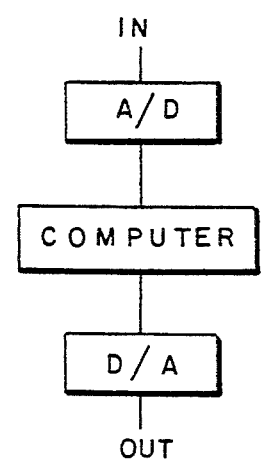
FIG. 13 is a block diagram of a computer embodiment.

Real-time computer emulation of tube circuits is possible since the mathematical quantities of operational amplifiers, resistors, capacitors, and non-linear networks are readily established. See my U.S. Pat. No. 4,995,084 which is incorporated herein by reference. FIG. 13 shows the input acquired by analog-to-digital converter 151, processed by computer 152, and output by digital-to-analog converter 153.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. A semiconductor emulation means for emulating a triode vacuum tube having an input voltage and current characteristics, an output voltage and current characteristic, and a gain characteristic, wherein said emulation means has an input and an output, comprising:
   an amplifier means for amplifying a signal at said input; and having an amplifier output;
   a first non-linear means connecting said amplifier output to said output.
   wherein said amplifier means, and said first non-linear means provide the emulation means with an emulation of the output voltage and current characteristic of said triode vacuum tube.

2. The emulation means of claim 1 wherein said first non-linear means has a voltage and current characteristic; and wherein the current through said first non-linear means is approximately proportional to the square of the voltage across said first non-linear means.

3. The emulation means of claim 1 wherein said amplifier means includes a second non-linear means for emulating the gain characteristic of said vacuum tube.

4. The emulation means of claim 3 wherein said second non-linear means produces second harmonics.

5. The emulation means of claim 1 including diode means shunting said input for emulating the input voltage and current characteristic of said vacuum tube.

6. The emulation means of claim 1 including current feedback means for sensing said output current and injecting a current in said input emulating the negative grid current input characteristics of said vacuum tube.

7. The emulation means of claim 1 wherein said first non-linear means includes series diodes and parallel resistors connected in a ladder.

8. The emulation means of claim 1 wherein said first non-linear means includes series connected pairs of a parallel resistor and diode.

9. The emulation means of claim 1 wherein said amplifier means and said first non-linear means are performed digitally upon digital representations of input and output voltages and currents.

10. The emulation means of claim 1 including a third non-linear means for nonlinearly connecting a second output to said amplifier means.

11. A semiconductor vacuum tube emulation means for emulating a pentode vacuum tube having an input voltage and current characteristic, an output voltage and current characteristic, and a transfer characteristic, said emulation means having an input and an output, comprising:
  an amplifier means for amplifying an input signal and a feedback signal and producing an output signal at said output; and
  first non-linear means for connecting said output to said amplifier means and supplying said feedback signal;
  wherein said amplifier means and said first non-linear means operate to produce output signals whose current and voltage characteristic emulate the output voltage and current characteristic of said pentode vacuum tube.

12. The emulation means of claim 11 wherein said first non-linear means has a voltage and current characteristic; and wherein the current through said first non-linear means is approximately proportional to the square of the voltage across said first non-linear means.

13. The emulation means of claim 11 wherein said amplifier means includes second non-linear means for emulating the transfer characteristic of said pentode vacuum tube.

14. The emulation means of claim 13 including gain control means for sensing the output and controlling said transfer characteristic.

15. The emulation means of claim 11 wherein said emulator means emulates pentode output voltage and current characteristic around a load line.

16. The emulation means of claim 11 which includes means connected to said output for permitting flyback.

17. The emulation means of claim 11 which includes diode means shunting said input for emulating the input characteristics of said vacuum tube.

18. The emulation means of claim 11 wherein said amplifier means and first non-linear means are performed digitally upon digital representations of input and output voltages and currents.

19. A semiconductor emulator of a vacuum tube having a cutoff region comprising:
  input means for receiving an input signal;
  gain means responsive to said input signal for producing an amplified signal; and
  first non-linear output means having a plurality of series forward conducting diode means for introducing second or higher order harmonics into said amplified signal without clipping, controlling harmonic generation when going into said cutoff region and producing an output signal.

20. The emulator of claim 19 wherein said gain means includes harmonic means for introducing harmonics into said amplified signal.

21. The emulator of claim 19 wherein said input means includes non-linear means for clipping said input signal.

22. The emulator of claim 19 wherein said gain means is also responsive to a feedback signal from said output means.

23. The emulator of claim 19 including feedback means responsive to said output for injecting a current into said input.

24. The emulator of claim 19 including a second output means for producing a second output signal with the cutoff behavior of a polarity opposite the polarity of said first output means.

25. A semiconductor amplifier means for emulating the gain changing effects of a pentode vacuum tube amplifier created by its power supply having a load response to the loading by said pentode amplifier, comprising:
  controlled gain means for producing an output signal having pentode vacuum tube voltage and current characteristic in response to an input signal and in response to a gain control signal; and
  filter means for emulating said load response of said power supply and producing said gain control signal in response to output signals of said controlled gain means.

26. The effect means of claim 25 in which said controlled gain means is a controlled amplifier including a non-linear means for non-linearly amplifying said signals.

27. The effect means of 25 in which said filter means is linear.

28. The effect means of 25 in which said filter means is multipole.

29. The effect means of claim 25 in which said input, output and control signals are digital values and said controlled gain means and said filter means are programs in a computer.

30. A semiconductor circuit for emulating a vacuum tube cathode follower having grid conduction and consequential loading of the grid circuit and having grid, plate, and cathode terminals comprising:
  a transistor means having base, collector, and emitter terminals;
  wherein said base terminal is connected to a grid terminal, said emitter terminal is connected to a cathode terminal, and said collector terminal is connected only to a resistor means connecting said collector terminal to a plate terminal for emulating the plate resistance of said cathode follower and creating the effect of grid conduction of said cathode follower.

31. The circuit of claim 30 including output resistor means connect to said emitter terminal for emulating the output impedance of said cathode follower.

32. The circuit of claim 31 is which said resistor means includes diode means.

33. A semiconductor triode vacuum tube emulator comprising:
  grid, cathode and plate terminals;
  first means connected between said grid and cathode terminal for emulating the grid-to-cathode characteristic of said vacuum tube and including a diode means and a resistor means; and
  second means connected to said grid, cathode, and plate terminals for exhibiting output characteristics of a triode vacuum tube.

34. The emulator means of claim 33 wherein said second means exhibits the output characteristics of a triode vacuum tube around a load line.

35. The emulator of claim 34 wherein said first and second means exhibit a reduction in gain for an increasing signal.

36. The emulator of claim 34 wherein said second means includes transistor means for conveying the current in said plate terminal to said cathode terminal.

37. The emulator of claim 34 including current means responsive to current passing through said plate terminal for producing a current flowing out of said grid terminal.

38. The emulator of claim 34 wherein said second means includes an amplifier responsive to the signal on said grid terminal and a non-linear means nonlinearly connecting an output of said amplifier to said plate terminal.

39. A semiconductor output amplifier having an input, an output, and a power supply for emulating a push-pull pentode vacuum tube amplifier comprising:
 a phase splitter for receiving said input and producing first and second grid signals;
 a first non-linear amplifier including grid conduction emulation means for receiving said first grid signal and a first feedback signal and for producing a first drive signal;
 a second non-linear amplifier including grid conduction emulation means for receiving said second grid signal and a second feedback signal and for producing a second drive signal;
 a first output means for receiving said first drive signal and driving a first output current into said output;
 a second output means for receiving said second drive signal and driving a second output current into said output; and
 a feedback means responsive to signals on said output for producing said first and second feedback signals.

40. The amplifier of claim 39 which includes control means for biasing said first and second non-linear amplifiers in response to signals on said output.

41. Amplifier of claim 39, wherein said feedback means is non-linear.

42. The emulation means of claim 1 wherein said first non-linear means uses logarithmic and exponential characteristics of semiconductor junctions to produce a non-linear relationship between voltage across said first non-linear means to current flowing through said first non-linear means.

43. The emulation means of claim 11 wherein said first non-linear means uses logarithmic and exponential characteristics of semiconductor junctions to produce non-linear relationship between voltage across said first non-linear means to the current flowing through said first non-linear means.

44. The emulation means of claim 13 wherein said second non-linear means uses logarithmic and exponential characteristics of semiconductor junctions to produce a non-linear relationship between voltage across said second non-linear means to the current flowing through said second non-linear means.

45. The emulator of claim 19 wherein said input signal, amplified signal, and said output signals are represented by digital values and said input means, gain means and first output means are programs in a digital computer.

46. A solid state vacuum tube compression effect system having an input and an output including:
 a bias shifting means connected to said input for producing a first signal and including non-linear means for emulating grid conduction of a vacuum tube; and
 compression means for producing an output signal on said output in response to said first signal.

47. The effect means of claim 46 wherein said input, output, and control signal are digital values and said controlled means and said filter means are performed in a computer with computer programs.

48. The emulator of claim 30 wherein signals of said grid, plate, and cathode are digital values and said transistor means and said resistor means are represented by programs in a digital computer.

49. The emulator of claim 33 wherein signals on said grid, cathode and plate terminals are digital values and said first and second means are programs in a computer for emulating said grid-to-cathode characteristic and said output characteristic.

50. The system of claim 46 wherein said compression means includes:
 a controlled amplifier means for amplifying said first signal with a gain responsive to a second signal and producing said output signal; and
 a control means for producing said second signal in response to said output signal.

51. A semiconductor vacuum tube emulation means having grid, plate, and cathode terminals for emulating the characteristics of a vacuum tube, comprising:
 a diode means connected between said grid and cathode terminals for approximating grid-to-cathode current flow;
 an amplifier means connected to said grid and cathode terminals and having an output; and
 non-linear means for non-linearly connecting the output of said amplifier means to said plate terminal.

52. The emulation means of claim 51 in which said diode means includes a series resistor.

53. The emulation means of claim 51 wherein said non-linear means uses logarithmic and exponential characteristics of semiconductor junctions to produce a non-linear relationship between voltage across said non-linear means to current flowing through said non-linear means.

54. The emulation means of claim 51 wherein signals on said grid, plate, and cathode are digital values and said diode means, said amplifier, and said non-linear means are programs in a digital computer.

55. A solid state vacuum tube amplifier emulating system having an input and an output including:
 a variable gain amplifier means for amplifying said input with a gain responsive to a gain control signal, for producing said output and for emulating effects of grid conduction; and
 a gain control means for producing said gain control signal in response to said output.

56. The system of claim 55 wherein said gain control means includes filtering means for emulating behavior of a power supply supplying power for said tube amplifier.

57. The system of claim 55 wherein said variable gain amplifier mean includes means for creating harmonics.

58. The system of claim 55 wherein signals on said input and said output and said gain control signal are digital values and said amplifier means and said gain control means are programs on a digital computer.

59. A semiconductor system for emulating the output of a pentode vacuum tube amplifier having an input and having an output with current and voltage characteristics comprising:
 a non-linear amplifier means responsive to an input signal and a feedback signal for producing said output;
 feedback means responsive to said output for producing said feedback signal; wherein
 said amplifier means and said feedback means emulate said output voltage and current characteristics of said pentode vacuum tube characterized by a saturation region and a plurality of curves having different slopes.

60. The system of claim 59 wherein said non-linear amplifier means includes non-linear means for emulating grid conduction and that said non-linear amplifier is responsive to the input signal limited by emulated grid conduction.

61. The system of claim 60 wherein said non-linear means is a bias shifting means.

62. The system of claim 59 wherein said feedback means is non-linear.

63. The emulation means of claim 51 including transistor means for conveying current from said plate terminal to said cathode terminal.

64. The effect means of claim 25 wherein said controlled gain means includes limiting means so that said output signal is in response to a limited input signal and in response to said gain control signal.

65. The effect means of claim 25 wherein said gain means produces compression.

66. A triode tube emulating circuit having a grid terminal, an plate terminal, and a cathode terminal including:
   first diode means connected from said grid terminal to said cathode terminal for emulating grid current;
   amplifier means having inputs connected to said grid and cathode terminals for producing an amplified signal on its output;
   non-linear means connecting said output to said plate terminal and including resistor means and second diode means in series between said output and said plate terminal for converting the voltage between said plate terminal and said output to a diode voltage, and transistor means connected to said plate terminal and said second diode means for converting said diode voltage to a current having a non-linear relationship with the voltage between said plate terminal and said output.

67. A semiconductor vacuum tube emulation means having an input and an output for emulating the output current characteristic of a vacuum tube, comprising:
   an amplifier means, including limiting means for limiting an input signal, for amplifying said limited input signal and a feedback signal to produce an amplified signal;
   non-linear means having a saturation resistance means responsive to said amplified signal for providing an output signal; and
   feedback means connecting said output to said amplifier; wherein
   said saturation resistance means produces a saturation region in said output current characteristic, and said feedback means produces an unsaturated region in said output characteristic.

68. The emulation means of claim 67 wherein the gain of said amplifier means is controlled by a gain control means which is responsive to said output signal.

69. The emulation means of claim 68 wherein said gain control means includes filter means.

* * * * *